STRIPPING AND LAMINATING MACHINE

Filed Feb. 7, 1966 4 Sheets-Sheet 1

INVENTOR
ROBERT BERNARD HEIART

William B. Cullings

ATTORNEY

STRIPPING AND LAMINATING MACHINE

INVENTOR
ROBERT BERNARD HEIART

BY William B. Conklin, Jr.

ATTORNEY

STRIPPING AND LAMINATING MACHINE

Filed Feb. 7, 1966 4 Sheets-Sheet 3

INVENTOR
ROBERT BERNARD HEIART
BY William B. Cridlin, Jr.
ATTORNEY

STRIPPING AND LAMINATING MACHINE

INVENTOR
ROBERT BERNARD HEIART
BY William B. Cardli, Jr.
ATTORNEY

United States Patent Office 3,404,057

Patented Oct. 1, 1968

3,404,057

STRIPPING AND LAMINATING MACHINE

Robert Bernard Heiart, Middletown, N.J., assignor to E. I. du Pont de Nemours and Company, Wilmington, Del., a corporation of Delaware Filed Feb. 7, 1966, Ser. No. 525,469
6 Claims. (Cl. 156—522)

This invention relates to apparatus useful for delaminating a layer from a composite web and then applying the remaining layers to base materials. More particularly the invention relates to apparatus useful for delaminating a cover sheet from a composite photopolymer film and laminating the remaining supported photopolymerizable materials to base materials in either web or sheet form.

The invention is particularly useful in preparing photoresists used in assignee's copending patent application Ser. No. 447,016, filed Aug. 3, 1965 now Patent No. 3,295,781. In this process a photopolymer resist solution is coated on a transparent web support. A protective cover sheet is then applied. For use the cover sheet is stripped off and the supported photopolymer layer is laminated to the surface to be imaged. The laminated element is then exposed to actinic radiation through a process transparency in contact with the transparent support. The support is stripped off and the exposed photopolymer layer is developed by solvent washout of the unexposed areas. The metallic sheet is then etched or plated, etc., to give the desired image, which may be used for many purposes, such as printed circuits, metal name plates, printing plates, etc.

In working photoresist images it is advantageous to use the process of the copending application. Here the dry resist film is formed initially on a continuous flexible film support using highly developed web coating machinery with all its attendant advantages. The supported resist film is then laminated to a protective cover sheet. By this means a highly uniform and fully protected resist film can be made and easily stocked and handled. Then when required for preparation of photoresists, the apparatus of this invention strips off the cover film and laminates the uncovered surface of the supported photopolymer layer to the metal or other base. This again leaves the resist alyer protected from physical damage as the layer is now sandwiched between the base and the original support film. The layer can be exposed through the original, transparent support as disclosed in said copending application. Note that no solution handling or drying is involved in the actual application of the resist film to the substrate to be imaged, only a rapid dry lamination.

It is an object of this invention to provide simple, dependable apparatus for use while delaminating a cover sheet from a composite photopolymerizable element and laminating coverless composite webs to a base. A further object is to provide drive means for a delaminating-laminating apparatus that can compensate for variations in unwind and windup roll diameters. A still further object is to provide such apparatus that is easy to operate and gives uniform results over a long period of time. Still further objects will be apparent from the following description of the invention.

These and other objects are accomplished by an apparatus for preparing photoresist coated elements having a photopolymerizable layer obtained from a light sensitive element having a photopolymerizable composition arranged between a support and a protective cover layer which apparatus comprises (a) feed means for said light sensitive photopolymerizable element, (b) take-up means for removing said cover layer from said light sensitive element and being cooperatively actuated with said feed means, and (c) positively driven pressure roll means for securing said coverless light sensitive photopolymerizable element to a base.

In a further aspect, the unwind means is connected to overdrive the windup means through a linkage which permits slippage to compensate for variations in the diameter of the rolls on the unwind-windup cores.

Additionally, the basic apparatus can be provided with various means to vary the speed of web travel through the apparatus and the force used for lamination. In another modification, the pressure rollers can be heated by various means, e.g., internal electrical heaters, and therefore useful for thermal lamination. As is obvious, the operation of this apparatus should be conducted in surroundings which do not cause photopolymerization of the material.

The invention will now be described more fully with reference to the accompanying drawings which form a part of this application and wherein the same reference numbers refer to the same parts throughout the drawings.

Figure 3:
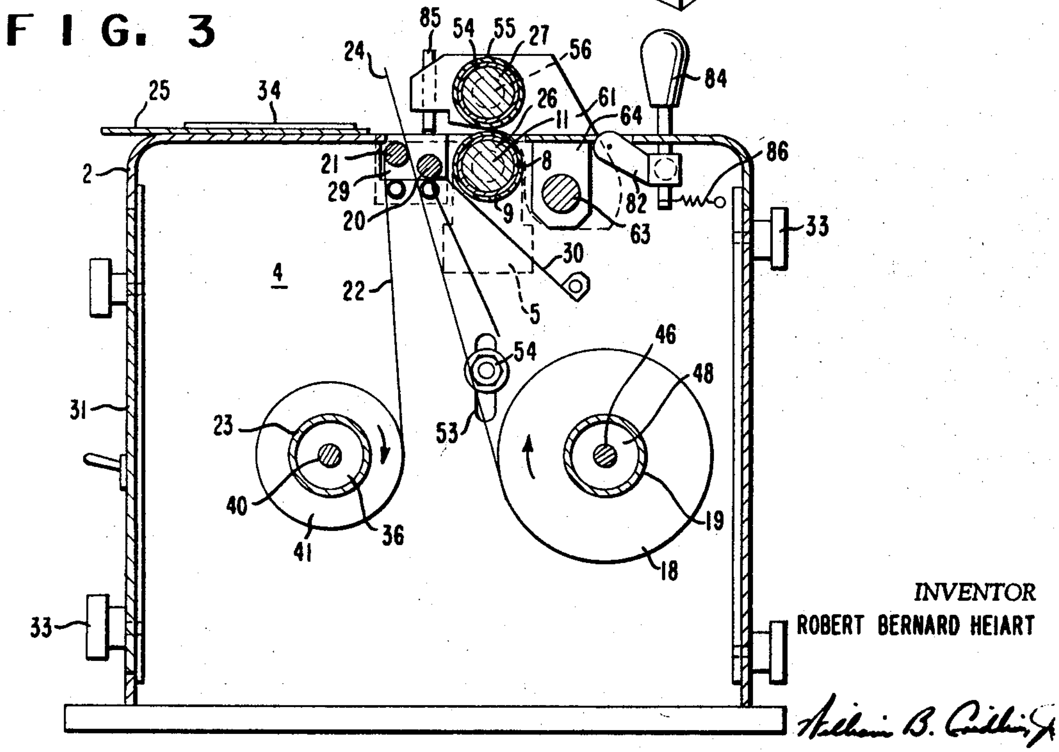
FIGURE 3 is a vertical view taken along the line 3—3 of FIGURE 2 with parts in section.

The basic elements of the apparatus of the invention are illustrated in FIGURE 3. A roll 18 of composite web is located within a housing on an unwind core 19. The web moves from the unwind through two idler rollers 20 and 21 wherein one layer 22 of the web is automatically stripped away. This delaminated layer is then rewound on a windup core 23.

The remaining layers 24 of the web and the base 25 to which these layers are to be laminated are then fed between two heated pressure rollers 26 and 27, i.e., in this embodiment the base is a sheet and is fed into the nip between the two rollers by hand, however, suitable sheet feeding means could be used, or if the base were in web form, web feeding means could be used. These rollers supply the necessary heat and pressure for thermal lamination. One of the rollers 26 is driven and when the other roller 27 is in its operational position, the movement pulls the web and base through the apparatus. The windup core and the unwind core are mechanically linked by a belt drive 43, see FIGURE 4. Thus the movement of the web, which drives the unwind core, also drives the windup. When the roller 27 is not in its operation position, the web and base will not be moved forward, thus the unwind and windup are only activated when the pressure rollers are set together.

In some applications, i.e., where the layer to be laminated to the base support is tacky at room temperature or an adhesive is used, the rollers 26 and 27 need not be heated and pressure alone can be used for the lamination. In other embodiments wherein only one side of the base is to have a layer laminated thereon, only one of the rollers need be heated.

The following is a detailed description of the various elements of an embodiment of the invention.

Figure 1:
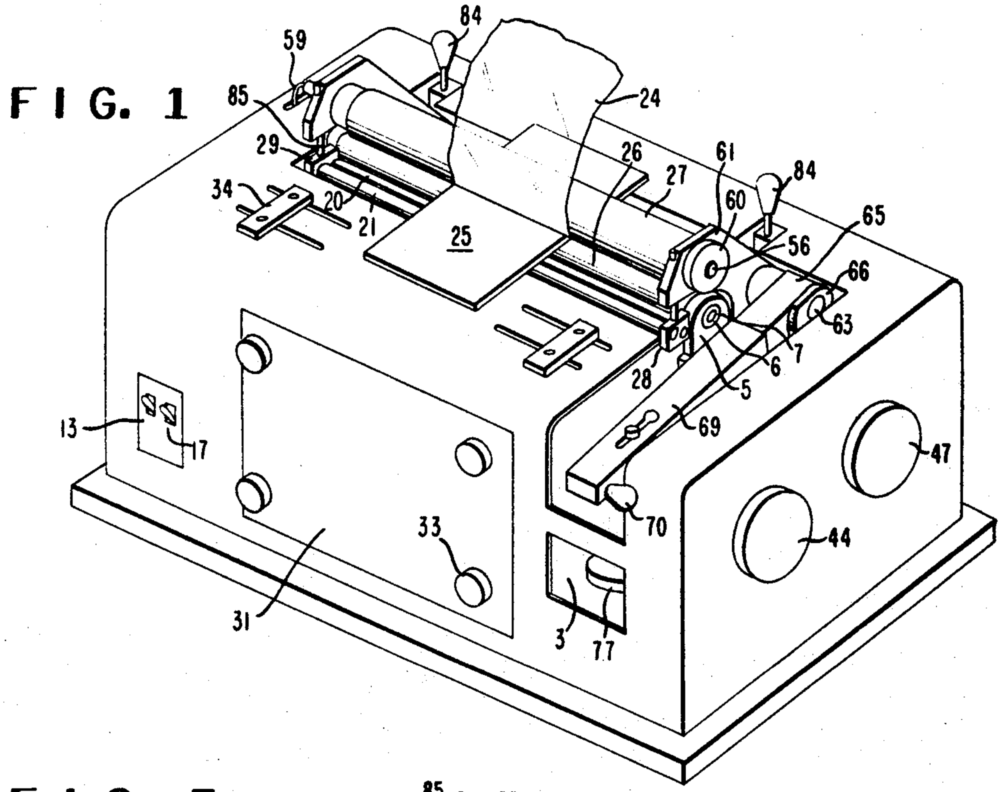
FIGURE 1 is an isometric view of an embodiment of the apparatus showing the front side.

Referring now to the drawings and more particularly to FIGURE 1, the apparatus has an outer housing that consists of a base 1 and a cover 2. The base may be made of wood or metal, and it may be desirable for it to have screened or filtered openings (not shown) to help dissipate any heat collected within the housing during operation. In the front and the rear of the cover 2 are removable sections 31 and 32. These sections are held in place by thumb screws 33 and are removed when access to the interior of the housing is desired. Two guides 34 are located on the top of the cover; they are adjustable and can be used to guide the base 25 into the nip formed by the pressure rollers 26 and 27.

Figure 2:
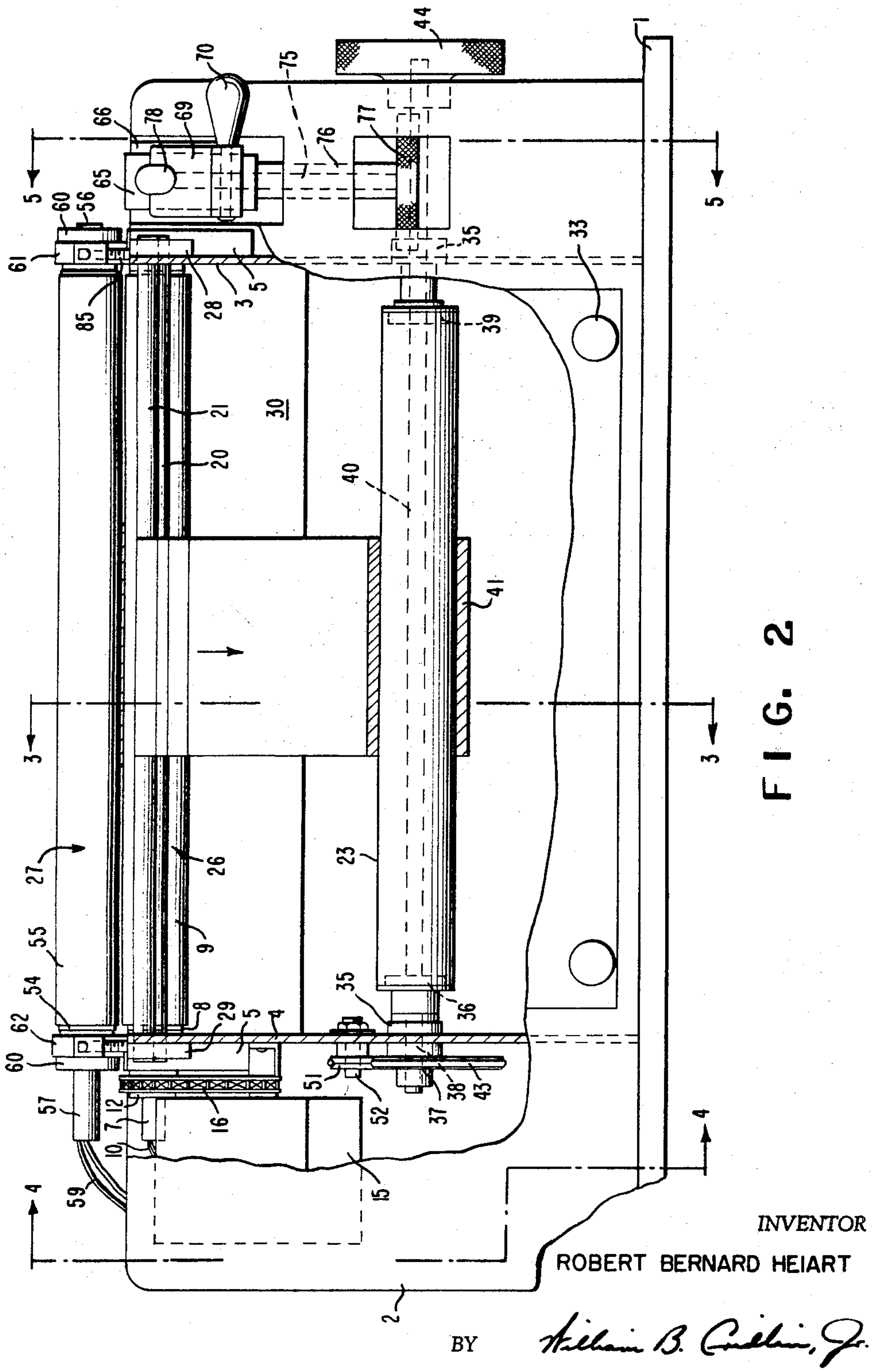
FIGURE 2 is an elevation view of the front side, with parts in section.

Within the housing as shown in FIGURE 2 the main frame assembly is composed of two side walls 3 and 4. Welded or bolted to each side wall is a bushing mount 5. Bushings 6 (FIGURE 1) are press fitted into suitable borings in the mounts 5. The bushing mounts and bushings rotatably support the shaft ends 7 of pressure roll 26.

The roll 26 extends between the two side walls and is made of a hollow brass tube 8 with a bonded rubber covering 9. The rubber covering should be one that will not be damaged by elevated temperatures, i.e., up to 175° C. Additionally, the covering should have a hardness, e.g., 40–60 durometer, such that the roller will be compliant or resilient. This is required to accommodate nonplanar bases during the lamination. The shaft ends 7 and tube 8 are hollow and within the hollow tube interior can be inserted a heating unit, e.g., an electric cartridge heater 11. The leads 10 for the heater will pass through the hollow shaft 7 and be connected to the heater power switch 13. If desired, a control unit (not shown) could be incorporated into the circuit so that the temperature produced could be varied.

Keyed on one shaft end of roller 26 is a driven sprocket 12. This sprocket 12 is linked to drive sprocket 14 on the output shaft of an electric motor 15 by an endless chain 16. The motor drives the sprocket 12 in the direction indicated in FIGURE 4. This movement will drive the unwind core 19 and windup core 23 in the directions indicated in FIGURE 3 as will be explained. The motor 15 is fastened to the side wall 4 by suitable fasteners. The power input for the motor 15 is connected to switch 17 which is located adjacent the heater control switch. A motor control unit (not shown) can be incorporated in the motor circuit to vary the speed of the drive sprocket 14.

Adjacent to pressure roller 26 are two idler rollers 20 and 21. These idler rollers extend between the two side walls and are rotatably journalled into idler roll supports 28 and 29 mounted on the side walls 3 and 4 by machine screws. The composite web from the unwind passes between the two idler rollers whereon layer 22 is stripped off by an abrupt change in direction.

Also fastened to and extending between the side walls is a heat shield 30; this shield protects the composite web from being overheated as it passes near the heated roller 26, particularly when the roll 26 is heated and the web is not moving.

Bushings 35 are inserted through side walls 3 and 4 below the idler rollers. Rotatably mounted through one of these bushings is a shaft 38 having a fixed mandrel 36 on one end. On the opposite end of the shaft 38, is keyed a sheave or grooved pulley 37; this sheave is linked to another sheave 42 by a round, fabric belt 43. The function of these sheaves and belt will be described subsequently. Rotatably inserted through the bushing 35 in side wall 3 is a movable mandrel 39. The windup core 23 is held for rotation by these mandrels. The delaminated cover layer 22 is wound into a roll 41 on the core 23. Extending through a hole bored through the movable mandrel 39 is a clamp rod 40; the hole is such that the rod can rotate independently of the mandrel 39. The clamp rod 40 extends from outside the housing, where a knob 44 is pinned to it, through the interior of the housing to the fixed mandrel 36. The end of the rod within the housing is threaded so it can be screwed into a threaded, bored hole in the fixed mandrel 36. Thus by turning the knob 44, the movable mandrel can be adjusted to permit the insertion and removal of the core 23 from the mandrels.

Also within the housing, the roll 18 of composite film, i.e., photopolymer resist film, is held for rotation by a similar structure to that for core 23. The roll has been wrapped on a core 19 during its manufacture. The core 19 is rotatably mounted on a movable mandrel 45 and a fixed mandrel 48 (see FIGURE 3) with a clamp rod 46 extending through the movable mandrel to threadably engage the fixed mandrel 48. This clamp rod 46 also has a turning knob 47 on one end. The shaft 49 on which the fixed mandrel 48 is mounted is rotatably inserted through a bushing (not shown) in side wall 4 and grooved sheave 42 is pinned to this end.

Figure 4:
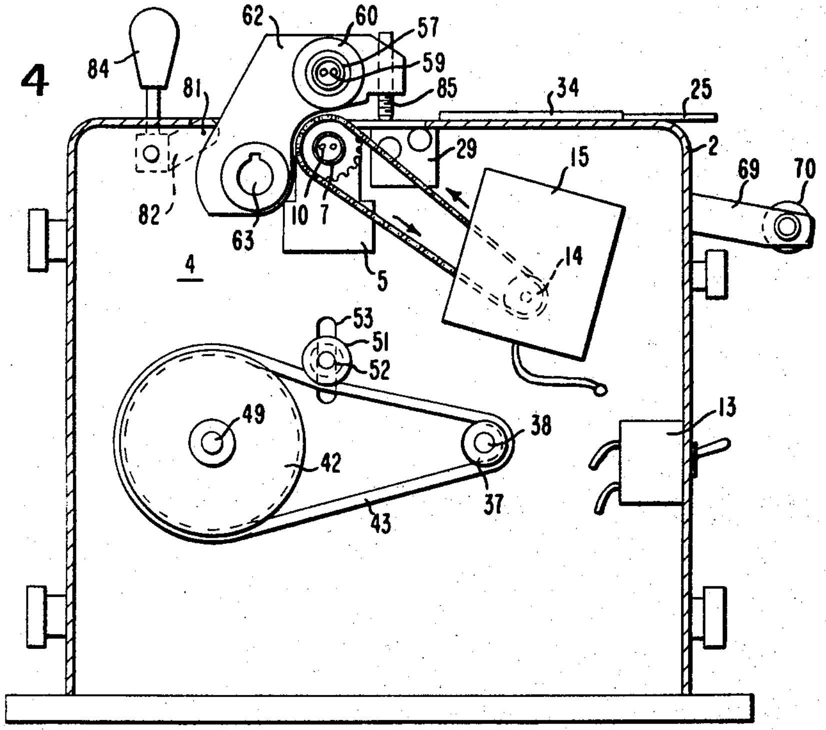
FIGURE 4 is a vertical view taken along the line 4—4 of FIGURE 2 with parts in section.

The sheave 42 is linked to sheave 37 by the round fabric belt 43 as shown in FIGURE 4. The diameter of sheave 42 is on the order of four times that of sheave 37. Therefore, when the composite web is pulled off of the unwind core 18, this movement rotates the unwind mandrels and sheave 42. Sheave 42 then over-drives sheave 37 through the belt linkage. Another sheave 51 rides on top of the round belt and it is rotatably mounted on an adjustable take up support 52 that fits through an opening 53 in side wall 4 and is held in this location by a washer and nut 54. Sheave 51 is used to take up the slack in the belt 43 in order to adjust the tension and slip of the belt drive.

The top pressure roller 27 has the same design as the bottom pressure roller 26. The roller is composed of a hollow tube 54 with a bonded rubber covering 55 and two shaft ends 56 and 57. Within the interior of the roller is located an electrical cartridge heater 58 whose leads 59 extend through shaft end 57 and are connected in series with the leads of heater 11.

Figure 6:
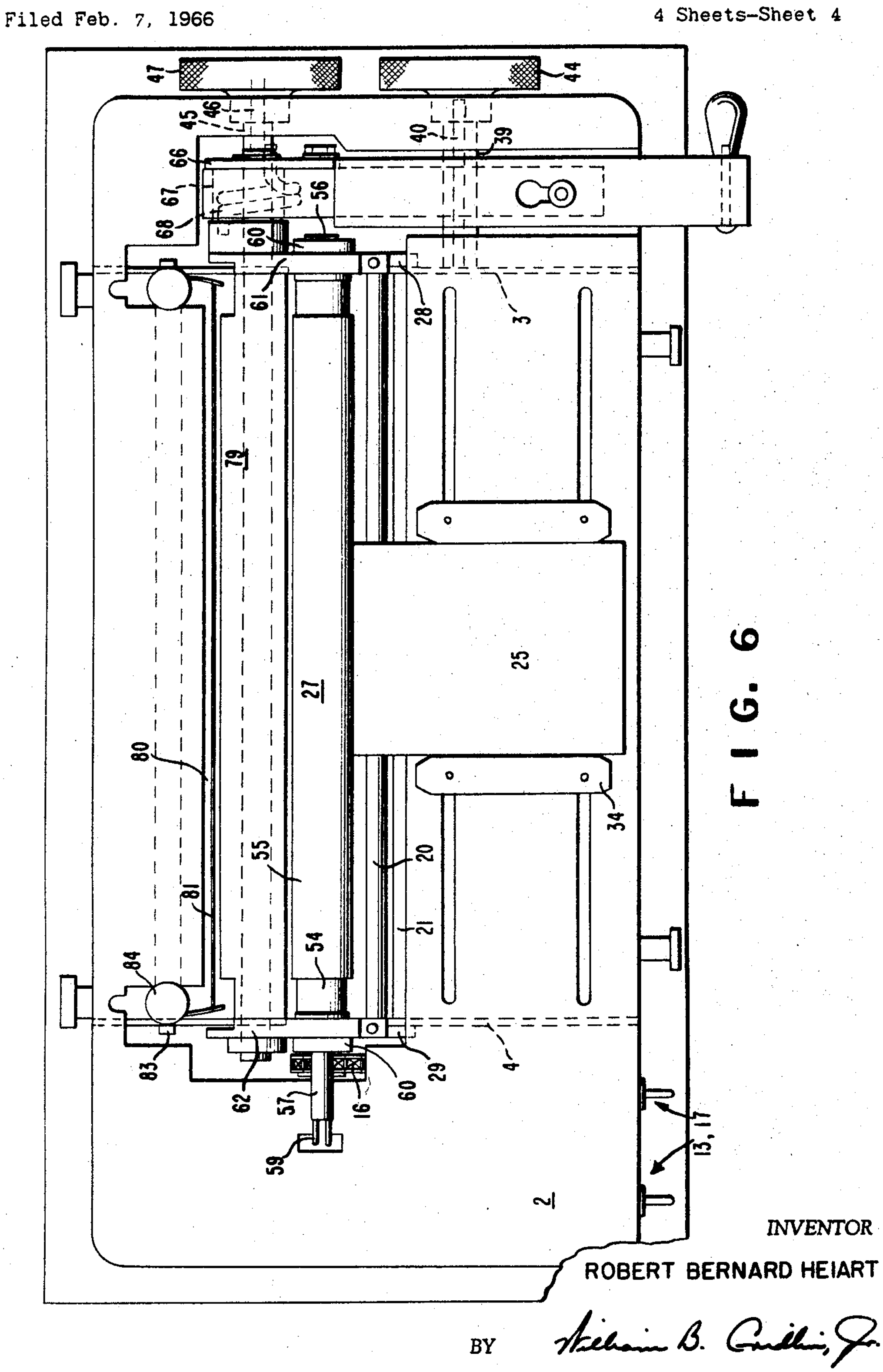
FIGURE 6 is a plan view of the top of the apparatus.

The shaft ends 56 and 57 are rotatably journalled in bushings 60 which are press fitted into roll supports 61 and 62 respectively. The roll supports are each keyed to a shaft 63 (see FIGURE 3) that extends between the two sidewalls. The shaft 63 is rotatably journalled through blocks 64 welded or bolted to the side walls. One end of the shaft 63 extends through roll support 61 and also through a lever arm 65 and a plate 66 which is mounted on the lever arm. This shaft end is retained in place by a snap ring 50.

Where the shaft 63 extends through the lever arm 65, the bored hole 67 is larger than the diameter of the shaft. Within this hole 67 and surrounding the shaft 63 is a torsion spring wire 68 (see FIGURE 6). One end of the spring 68 is inserted into a bored hole in the roll support 61 and the other end in a hole in the plate 66. With this arrangement, the movement of the lever arm 65 is transmitted to the roll supports 61 and 62 and shaft 63 until the movement of the roller 27 is prevented by adjusting screws 85 extending through the roll supports 61 and 62 or by the base to be laminated. After that, the downward movement of the lever arm 65 merely applies additional force by twisting spring 68.

Figure 5:
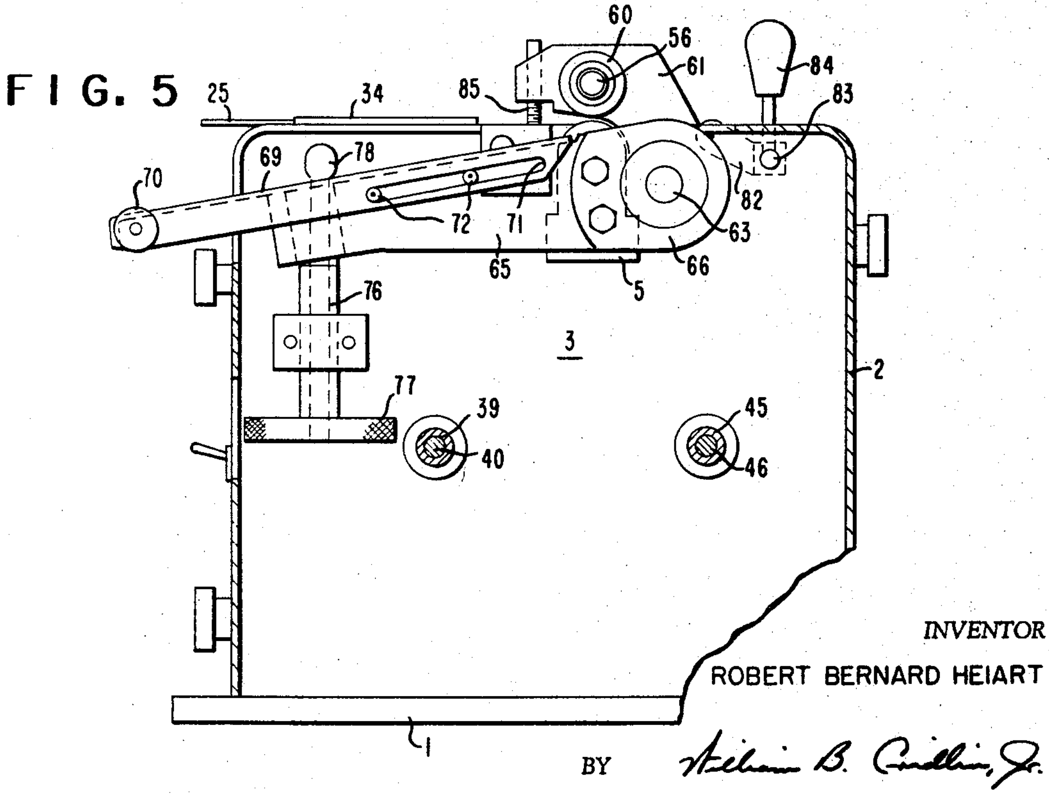
FIGURE 5 is a vertical view taken along the line 5—5 of FIGURE 2 with parts in section.

On the lever arm 65, a lever arm slide 69 is slideable mounted as shown in FIGURE 5. The slide 69 has a knob 70 at its lower end, the knob is added for ease in manual operation. On the sides of the slides are openings 71 (only one shown) which coact with pin spacers 72 mounted through the lever arm 65 to limit the amount of movement of the slide.

The top of the slide has an elongated opening 73 with one enlarged end portion 74. Through this opening 73 extends an adjusting rod 75, having a spherical tip 78; the tip being of such diameter that it will not pass through opening 73 but will pass through the enlarged end opening 74. This rod also extends through a suitable opening in the lever arm and is threaded in an adjusting screw block 76 fixed to side wall 3. A knurled knob 77 is keyed to the other end of the rod 75 to permit manual manipulation and adjustment. The movement of the rod 75 determines the position of the lever arm which, as previously explained, adjusts the twist on the spring.

When it is desired for the lever arm to be moved up and down, the knob 77 is turned moving the tip 78. Since the tip cannot pass through opening 73, this movement moves the lever arm. Once the desired position of the lever arm has been obtained, it is locked there by the coaction of tip 78 and the opening 73. When it is desired to move the top roller 27 completely away, i.e., for cleaning purposes, the slide can be moved so that the tip 78 will pass through the enlarged opening 74. The lever arm 65 can then be lifted up and the roller 27 retracted.

The location of the lever arm determines the force produced by pressure roller 27. Additionally, the adjusting screws 85 can be positioned to coact with idler roll supports 28 and 29 to adjust and set the gap between the rollers 26 and 27. The adjustment of the gap permits the apparatus to accommodate various base thicknesses. The adjusting screws 85 must be so adjusted that the base supports the rolls when it is in the nip rather than adjusting screws.

Located behind the pressure rolls 26 and 27 is a section 79 of the cover, this section forms part of the surface over which the base 25 is moved after being laminated with one or more layers. Behind this section is an opening 80, the opening extending essentially the length of the housing between the side walls. In this opening a Nichrome wire cutter 81 is held by two spaced brackets 82. The brackets 82 are mounted on a rod 83 pivotally journalled between the two side walls. Two knobs 84 which extend above the cover for manual operation, are mounted on the rod near the side walls. The cutter wire 81 is connected by suitable leads to the drive motor 15 circuit. Thus when the drive motor is energized, this wire will pass an electric current and become heated. Suitable springs 86 (see FIGURE 3) can be used to hold the wire in the noncutting position.

In operation, the removable sections of the covers 31 and 32 are removed for access into the interior of the housing. A roll 18 of composite web, such as described in Celeste, Ser. No. 477,016, filed Aug. 3, 1965, on a core 19 is inserted on the fixed mandrel 48. The knob 47 connected to the clamp rod 46 is then turned until the movable mandrel 45 is snug against the core 19 and the core is securely held by the two mandrels for rotation. The composite web is then guided through the housing and passed between the two idler rolls 20 and 21. At this time, a layer 22 is stripped off manually. Subsequently, this layer is automatically stripped off by the abrupt change of direction as it is pulled around idler roll 21 by the windup core 23. This layer 22, which can be the cover sheet is attached to the windup core 23. This core has been mounted between fixed mandrel 36 and movable mandrel 39 in the same manner as the unwind core 19. A length of the remaining layers 24 of the web is then pulled outside the housing. A base 25 is placed on the cover 2 between the guides 34. If it is desired to laminate a layer to one side of the base, the remaining layers 24 are aligned with the support and fed into the nip between the pressure rollers. If it is desired to laminate layers to both sides of the base, the remaining layers 24 should be pulled through the machine until an amount of web sufficient to cover the base is above the cover. The base with web on top and below (as shown in FIGURE 1) is then fed into the nip, thus laminating both sides simultaneously.

When the web is pulled off the unwind core 19, either manually or by the driven pressure roller 26, this movement rotates sheave 42. Sheave 42 is mechanically linked to sheave 37 through the belt 43. Thus, the movement of the web rotates sheave 37 which in turn winds up the stripped layer 22 on the windup core 23. As previously set forth, sheave 42 is four times the size of sheave 37 and the two sheaves are linked together by a round, felt belt which permits slippage. Through this linkage, the rotation of the unwind core 19 over-drives the windup core 23 and compensates for variations in the roll diameters on the unwind and windup cores. Additionally with this drive mechanism, the windup core is only rotated when it is needed to take up the stripped off layer 22.

After the web has been threaded through the housing and the actual lamination is to take place, switch 13 is closed to energize the heaters 11 and 58. After the heaters have obtained the desired roller temperature, switch 17 is turned on to energize the cutting wire 81 and electric motor 15. The electric motor through the chain drive rotates roller 26. Lever arm 65 is then adjusted by knob 77 to produce the desired nip force between rollers 26 and 27 for the pressure required during lamination.

The base is then fed into the nip, manually in this embodiment, with a layer 24 on one or both sides. The driven roller 26 in conjunction with the undriven pressure roller 27 intermittently propels the base and web 24 through the machine. The heat and pressure supplied by the rollers will provide the necessary conditions for lamination of the web 24 to the base. The resilient surfaces of the rollers allow them to conform to the surfaces being laminated even if they are nonplanar.

When the lever arm 65 is raised, the torsion spring acts to retract pressure roll 27. When this occurs, the driven rubber roll 26 will not propel the web or base; it will merely slip on its rubber surface. Adjusting pressure roll 27 for service requires the following: First the adjusting screws are retracted. The base is inserted in the nip and knob 77 is adjusted to give the desired force. At this point, adjusting screws 85 are seated. The base is then removed and the adjusting screws backed off a quarter of a turn. This gap setting is needed to conveniently allow a partial clearance to insert the base and to keep roll 27 from coming down on the hot resist.

After the base support has been laminated and has passed between the rollers, the hot wire cutter 81 is pivoted through the opening 80 to sever the web 24. This leaves the apparatus ready to laminate the next base.

The described apparatus can be modified in many ways without departing from the spirit of the invention. Thus, a similar unwind-windup and stripping mechanism can be located above the pressure rollers. This mechanism feeds two webs into the nip and thereby laminates both sides without the necessity of pulling the web out manually. Means can be added to provide automatic feeding of the base into the nip; and in some embodiments, the base can be in flexible web form and suitable pull rolls can be incorporated into the apparatus for unwinding and winding the web with the windup being mechanically linked to the composite web unwind for intermittent drive.

The various parts of the machine can be made from conventional materials of construction. The frame and covers can be made of metal including steel, steel alloys, aluminum, aluminum alloys, copper, brass, plastic materials, etc. They may be painted or provided with protective surfaces.

This apparatus can be used to laminate bases in either sheet or web form. The bases could be rigid or flexible, e.g., metal sheets, metallic coated polymeric material, ceramic, plastic, glass, etc.

An advantage of this apparatus is that it provides high quality laminations and requires no particular skill to operate. The apparatus is simple in construction, dependable in operation, self-contained, portable and semi-automatic. It is easy to operate in minimum light conditions where light sensitive materials can be safely utilized.

The embodiments of the invention in which an exclusive property or privilege is claimed are defined as follows:

1. An apparatus for preparing photoresist-coated elements having a photopolymerizable layer obtained from a light sensitive element having a photopolymerizable composition arranged between a support and a protective cover layer which apparatus comprises:

(a) free moving feed means for said light sensitive photopolymerizable element, (b) take-up means for removing said cover layer from said light sensitive element, said take-up means being actuated by said feed means at a rate greater than feed out, (c) drive means for moving said coverless element, and (d) pressure roll means for securing said coverless light sensitive photopolymerizable element to a base while pulling said coverless element through said roll means, said roll means being actuated by said drive means.

2. An apparatus as defined in claim 1 where said take-up means comprises a delaminating roll for removing said cover from said light sensitive element and wind-up means for receiving said cover, said wind-up means being actuated by said feed means.

3. An apparatus as defined in caim 2 where said wind-up means is actuated by said feed means by a slip linkage means.

4. An apparatus as defined in claim 1 having cutting means in association with said roll means to cut said base as it leaves said roll means.

5. An apparatus as defined in claim 1 where said roll means comprises a stationary roll and a coacting adjustable roll maintained under constant tension during operation.

6. An apparatus as defined in claim 5 where at least one of said rolls contains a heating element.

References Cited

UNITED STATES PATENTS

| | | | |
|---|---|---|---|
| 2,680,468 | 6/1954 | Lewis | 100—93 |
| 2,732,880 | 1/1956 | Hawk | 156—552 XR |
| 2,776,510 | 1/1957 | Klopfenstein | 100—93 |
| 3,027,285 | 3/1962 | Eisner et al. | 156—359 |

EARL M. BERGERT, *Primary Examiner.*

M. L. KATZ, *Assistant Examiner.*